United States Patent [19]
Yamamoto

[11] Patent Number: 5,668,410
[45] Date of Patent: Sep. 16, 1997

[54] PROJECTING ELECTRODE STRUCTURE HAVING A DOUBLE-LAYER CONDUCTIVE LAYER

[75] Inventor: Mitsuhiko Yamamoto, Akishima, Japan

[73] Assignee: Casio Computer Co., Ltd., Tokyo, Japan

[21] Appl. No.: 686,325

[22] Filed: Jul. 25, 1996

Related U.S. Application Data

[63] Continuation of Ser. No. 378,742, Jan. 26, 1995, abandoned.

[30] Foreign Application Priority Data

Jan. 31, 1994 [JP] Japan ..................... 6-029088

[51] Int. Cl.$^6$ .................... H01L 29/43; H01L 23/50
[52] U.S. Cl. .............. 257/737; 257/762; 257/763; 257/766; 257/775
[58] Field of Search .................. 257/737, 738, 257/741, 751, 762, 763, 765, 766, 773, 775

[56] References Cited

U.S. PATENT DOCUMENTS

| | | | |
|---|---|---|---|
| 4,922,321 | 5/1990 | Arai et al. | 257/737 |
| 4,980,555 | 12/1990 | Hartley et al. | 250/338.3 |
| 5,079,420 | 1/1992 | Turnbull | 250/338.3 |

FOREIGN PATENT DOCUMENTS

| | | | |
|---|---|---|---|
| 0144823 | 6/1993 | Japan | 257/737 |
| 0243231 | 9/1993 | Japan | 257/737 |
| 0251455 | 9/1993 | Japan | 257/751 |
| 0251449 | 9/1993 | Japan | 257/737 |
| 0335316 | 12/1993 | Japan | 257/737 |
| 0084917 | 3/1994 | Japan | 257/737 |

Primary Examiner—Peter Toby Brown
Attorney, Agent, or Firm—Frishauf, Holtz, Goodman, Langer & Chick

[57] ABSTRACT

A projecting electrode structure, having an electrode provided on a substrate, a first conductive layer provided on the electrode, an insulating projection provided at the center of the upper surface of the first conductive layer, the projection having the largest size smaller than the size of the upper surface, and a second conductive layer covering the surface of the projection and that part of the first conductive layer surrounding the projection and being electrically connected to the first conductive layer. A process for forming a projecting electrode includes the steps of providing the first conductive layer by vacuum deposition or spattering, providing the projection by photolithography, and providing the second conductive layer by vacuum deposition or spattering. This process eliminates the need for electroplating for forming the projecting electrode. It does not have a disadvantage in electroplating using a plating solution such as a defective appearance in a projecting electrode caused by air bubbles from the plating solution.

19 Claims, 3 Drawing Sheets

PROJECTING ELECTRODE STRUCTURE HAVING A DOUBLE-LAYER CONDUCTIVE LAYER

This application is a Continuation of application Ser. No. 08/378,742, filed Jan. 26, 1995, now abandoned.

BACKGROUND OF THE INVENTION

1. Field of the Invention

The present invention relates to a projecting electrode structure in semiconductor devices such as a bump electrode structure and a process for forming the projecting electrode structure.

2. Description of the Related Art

A prior-art process for forming a projecting electrode (i.e. a bump electrode) on a semiconductor substrate comprises, for example, the steps of forming a plating resist layer on a projecting-electrode forming surface of the substrate, forming an opening in the plating resist layer by etching the plating resist layer, causing a pad to appear in the opening, and plating the pad with a metal such as gold so that the metal forms the projecting electrode.

FIGS. 3(A) to 3(E) illustrate a prior-art process for forming a projecting electrode on the substrate. As shown in FIG. 3(A), an aluminum electrode 33 is first formed on a semiconductor substrate 31 via an oxide layer 32 of silicon oxide. A passivation layer 34 covers the edge of the aluminum electrode 33. The passivation layer 34 provides an insulating layer of silicon oxide or silicon nitride.

As shown in FIG. 3(B), a metal substrate layer 35 for passing a plating current in an electroplating step described below is subsequently formed by a thin-film formation method such as vacuum deposition or sputtering on the aluminum electrode 33 and the passivation layer 34. The metal substrate layer 35 has a trilayered structure, not shown.

In the trilayered structure of the metal substrate layer 35, a first layer adjoining an aluminum electrode 33 serves to bond the aluminum electrode 33 to the passivation layer 34. The first layer is made of chromium (Cr), titanium (Ti) or a titanium-tungsten (W) alloy. A second layer (i.e. a barrier layer) serves to prevent or retard a mutual diffusion between aluminum and the metal material for the projecting electrode. The second layer is made of platinum (Pt), palladium (Pd), copper (Cu) or nickel (Ni). A third layer (if necessary) may serve to prevent the oxidation of the surface of the barrier layer and/or keep the shear strength of the barrier layer good in a bump plating step of the prior-art process for forming a projecting electrode. The third layer is made of gold (Au) or the like and has a thickness of about 500–2000 Å.

A plating resist is subsequently applied by spin-coating or the like to the surface of the metal substrate layer 35. As well known, the applied plating resist is exposed through a glass mask (not shown) and developed to be patterned. Thus, the plating resist layer 36 and a predetermined opening 37 are formed as shown in FIG. 3(C).

As shown in FIG. 3(D), the substrate 31 is subsequently faced down. As well known, the face of the substrate 31 is placed in a bump-plating cup (not shown) and plated. The plating precipitates a projecting electrode metal 38 (gold or a solder) in the opening 37 in the plating resist layer 36. The projecting electrode metal 38 has a thickness of about 15–25 µm.

As well known, the plating resist layer 36 and an unnecessary part of the metal substrate layer 35 are eliminated by etching or the like. Thus, the projecting electrode 39 is formed as shown in FIG. 3(E).

As described above, the prior-art process for forming the projecting electrode 39 is an electroplating process using a plating solution (a wet process). In the electroplating process, it is very difficult to control the plating solution. In particular, since the substrate 31 is faced down and the face of the substrate 31 is placed in the plating cup, air bubbles from the plating solution stay on the face of the substrate 31 and in the opening 37 to disable a stable bump plating. In addition, a gas caused by an electrochemical reaction in the precipitation of a plating metal also stays on the face of the substrate 31 and in the opening 37 to hinder the deposition of a bump-plating.

Thus, the prior-art bump-plating process causes defective appearances (a depression, a hole etc.) in the projecting electrode due to air bubbles from the plating solution, and degrades the yield of products, the stability of the surface state of the projecting electrode, the hardness of the projecting electrode. On the other hand, a dispersion in the height of the projecting electrode is increased. That is, it is technically difficult to form a uniform projecting electrode by an electroplating process.

SUMMARY OF THE INVENTION

The present invention was made in view of the above-described situation.

A primary object of the present invention is to provide a projecting electrode structure which can be formed by a thin-film formation technique (a dry process) instead of an electroplating technique (a wet process).

Another object of the present invention is to provide a process for forming a projecting electrode structure.

In order to achieve the objects, the projecting electrode structure of the present invention comprising an electrode provided on a substrate, a first conductive layer provided on the electrode, an insulating projection provided at the center of the upper surface of the first conductive layer, the insulating projection having the largest size smaller than the size of the Upper surface of the first conductive layer, and a second conductive layer covering the surface of the insulating projection, the second conductive layer covering that part of the first conductive layer surrounding the insulating projection, and the second conductive layer being electrically connected to the first conductive layer.

The process for forming the projecting electrode structure

A second aspect of the present invention comprises the steps of providing a substrate having an electrode, providing a first conductive layer on the electrode, providing an insulating projection at the center of the upper surface of the first conductive layer, the insulating projection having the largest size smaller than the size of the upper surface of the first conductive layer, and providing a second conductive layer so that the second conductive layer covers the surface of the insulating projection and that part of the first conductive layer surrounding the insulating projection.

Other objects, features and advantages of the present invention will be apparent from a consideration of the following description, taken in connection with the accompanying drawings.

DESCRIPTION OF THE PREFERRED EMBODIMENTS

A projecting electrode structure of a semiconductor device and a process for forming the projecting electrode structure according to embodiments of the present invention will be described with reference to FIGS. 1 and 2, hereinafter.

FIGS. 1(A)–1(E) and 2(A)–2(D) show the process for forming the projecting electrode structure according to an embodiment of the present invention. A semiconductor substrate is indicated at 1. An oxide layer is indicated at 2. An aluminum electrode is indicated at 3. A passivation layer is indicated at 4. A metal substrate layer is indicated at 5. An organic layer is indicated at 6. A resist layer is indicated at 7. An organic layer projection is indicated at 8. An organic projection is indicated at 9. A thin conductive layer is indicated at 11. A resist layer is indicated at 12. A projecting electrode is indicated at 13.

Figure 1A:
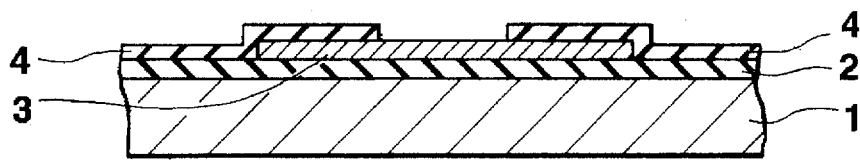
FIG. 1(A) shows the step of forming an aluminum electrode and a passivation layer on a semiconductor substrate of an inventive process for forming a projecting electrode.

As shown in FIG. 1(A), the aluminum electrode 3 is formed on the substrate 1 of a semiconductor, for example, silicon via the oxide layer 2 of silicon oxide. The passivation layer 4 serving as an insulating layer of silicon oxide or silicon nitride covers the periphery of the aluminum electrode 3.

Figure 1B:
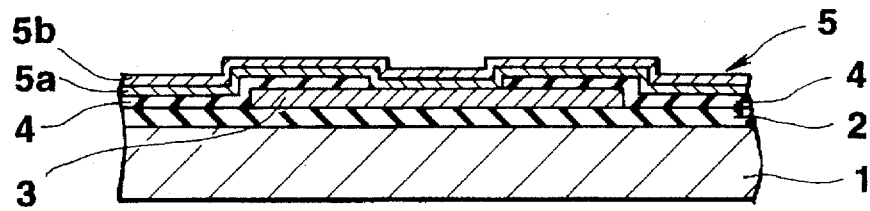
FIG. 1(B) shows the step of forming a metal substrate layer of the inventive process.
Figure 1C:
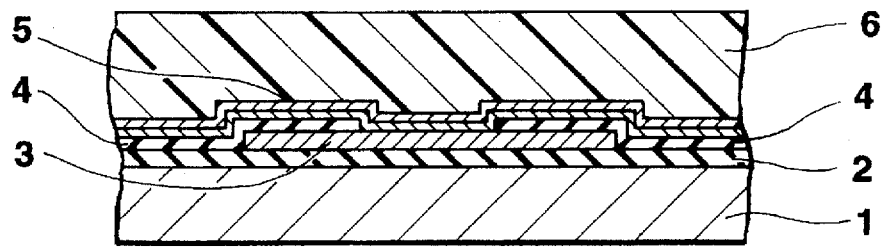
FIG. 1(C) shows the step of applying an organic layer of the inventive process.

As shown in FIG. 1(B), the metal substrate layer 5 (i.e. a first conductive layer) is deposited by the thin-film formation technique such as vacuum deposition or sputtering on the aluminum electrode 3 and the passivation layer 4 which are formed on the face of the substrate 1. The metal substrate layer 5 has a double-layered structure.

A first layer 5a of the metal substrate layer 5 adjoining the aluminum electrode 3 is made of a metal such as nickel (Ni) or aluminum (Al). This provides an enhanced bonding of the metal substrate layer 5 with the aluminum electrode 3 and the passivation layer 4. A second layer 5b of the metal substrate layer 5 is made of a metal such as chromium (Cr) or titanium (Ti). This provides an enhanced bonding of the metal substrate layer 5 with the organic layer 6.

Since the present invention eliminates the need for a metal material for the projecting electrode such as gold (Au), silver (Ag), copper (Cu), a solder or nickel (Ni) on the metal substrate layer 5, the present invention experiences substantially no mutual diffusion of metals. Thus, the metal substrate layer 5 need not have a prior-art trilayered structure such that the first and second layers 5a and 5b sandwich a barrier layer. In addition, the second layer 5b need not be thickened, so that the metal substrate layer 5 may be as thin as possible.

In the inventive process for forming a projecting electrode, the organic layer 6 of an insulating heat-resistant resin such as polyimide is applied by spin coating or the like to the surface of the metal substrate layer 5. Subsequently, an organic layer projection is formed by the photolithography described below. The organic layer 6 has a thickness of about 155–25 μm. The organic layer 6 may be photosensitive or non-photosensitive. For the purpose of the below description, the organic layer 6 is non-photosensitive.

The organic layer 6 applied to the surface of the metal substrate layer 5 is pre-cured (i.e. heated at 100° C. or higher). Subsequently, a resist (not shown) is applied to the organic layer 6. The resist layer is exposed to light energy (not shown) through a photomask (not shown).

Figure 1D:
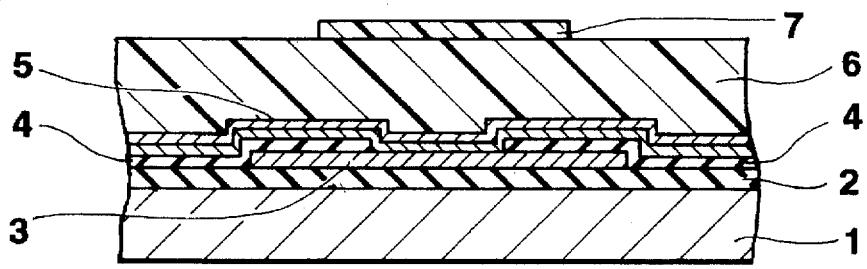
FIG. 1(D) shows the first development step of the inventive process.

Subsequently, the resist layer 7 is developed so that the resist layer 7 having a predetermined pattern which remains above only the aluminum electrode 3 is provided as shown in FIG. 1(D).

Figure 1E:
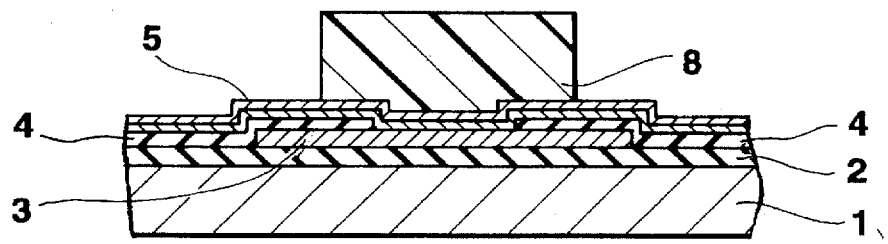
FIG. 1(E) shows the first etching and resist-eliminating step of the inventive process.

Subsequently, the organic layer 6 is etched and the resist layer 7 is eliminated. The organic layer 6 is patterned so that only that part of the organic layer 6 above the aluminum electrode 3 remains as shown in FIG. 1(E). Thus, the organic layer projection 8 having a predetermined pattern is formed.

If, for example, a positive resist is used as the resist, the positive resist which has been exposed is developed and the organic layer is concurrently etched using a developer (for example, MND-3 produced by Tokyo Oka K. K.) for the positive resist.

Subsequently, the substrate 1 having the organic layer projection 8 is heated at 300°–350° C. for post-curing.

Figure 2A:
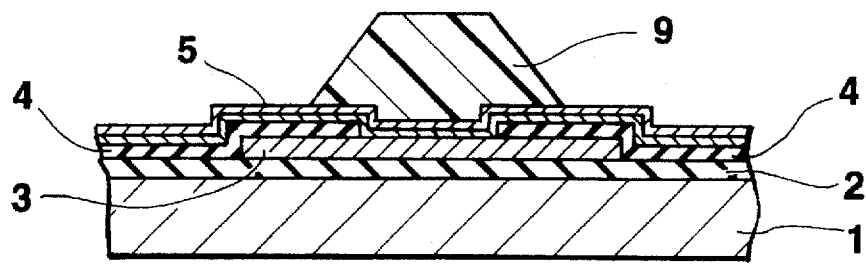
FIG. 2(A) shows the step of pre-curing an organic layer projection of the inventive process.

A contraction amount of part of the organic layer projection 8 remote from the aluminum electrode 3 and the metal substrate layer 5 is larger. A contraction amount of part of the organic layer projection 8 near the aluminum electrode 3 and the metal substrate layer 5 is smaller since this part adjoins the metal substrate layer 5. Thus, post-curing the substrate 1 forms the organic projection 9 having side surfaces tapered upwards at about 45°, as shown in FIG. 2(A).

Subsequently, a scum produced by etching the organic layer 6 is eliminated by ashing the scum using oxygen plasma or the like. An object of the ashing is to provide an enhanced contact of the metal substrate layer 5 with the thin conductive layer 11.

Figure 2B:
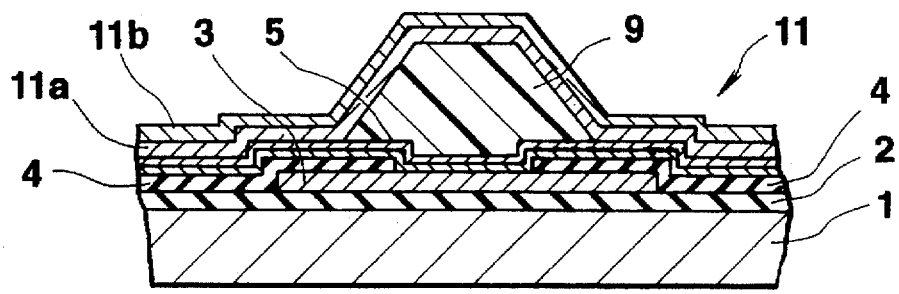
FIG. 2(B) shows the step of forming a thin conductive layer.

Subsequently, the thin conductive layer (i.e. the second conductive layer) 11 of a conductive material is formed on the metal substrate layer 5 and the organic projection 9 as shown in FIG. 2(B). In the below description, the conductive material is a metal. According to the present invention, the conductive material may however also be a conductive organic material.

Figure 2C:
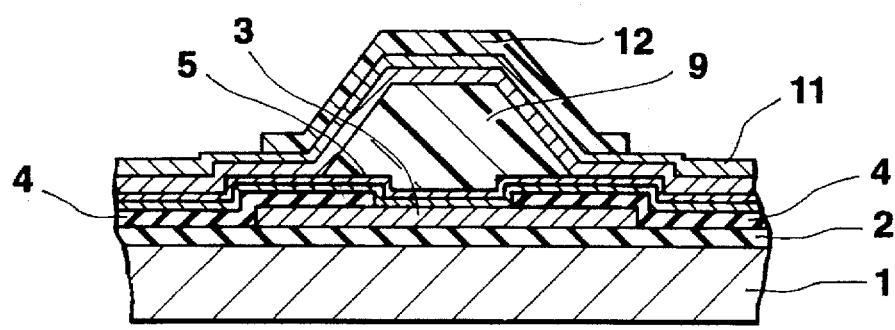
FIG. 2(C) shows the second development step of the inventive process.
Figure 2D:
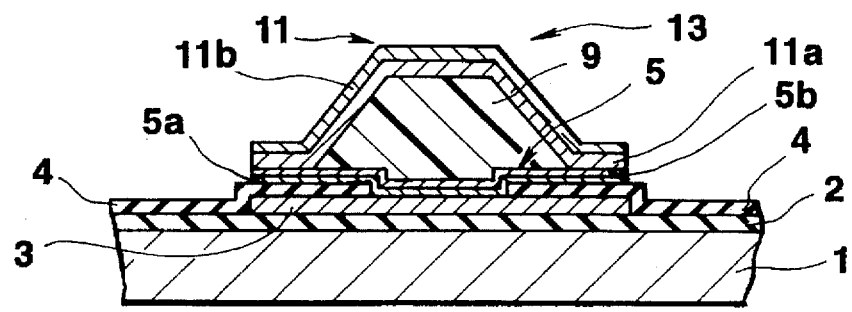
FIG. 2(D) shows the second etching and resist-eliminating step of the inventive process and a section of a final product of a projecting electrode structure according to the present invention.
Figure 3A:
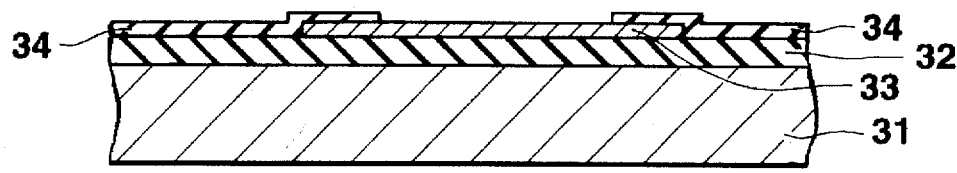
FIG. 3(A) shows the step of forming an aluminum electrode and a passivation layer on a semiconductor substrate of a prior-art process for forming a projecting electrode.
Figure 3B:
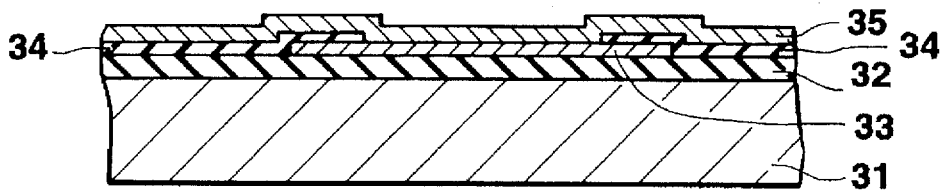
FIG. 3(B) shows the step of forming a metal substrate layer of the prior-art process.
Figure 3C:
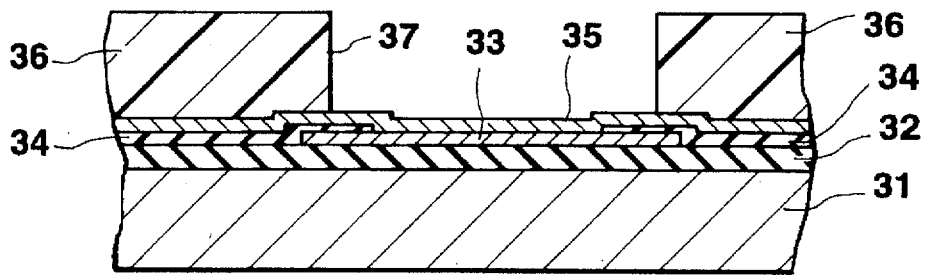
FIG. 3(C) shows the step of patterning a plating resist of the prior-art process.
Figure 3D:
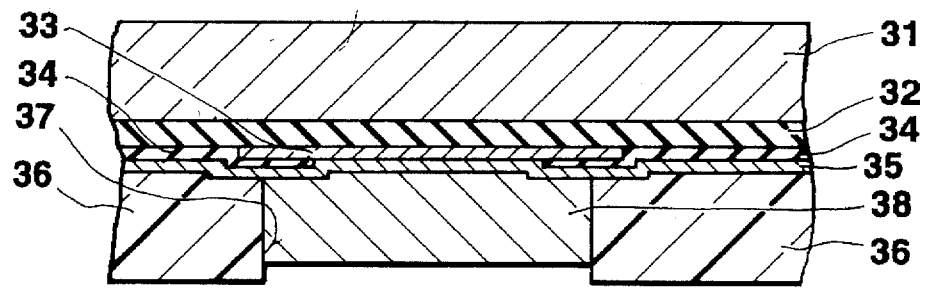
FIG. 3(D) shows the bump-plating step of the prior-art process.
Figure 3E:
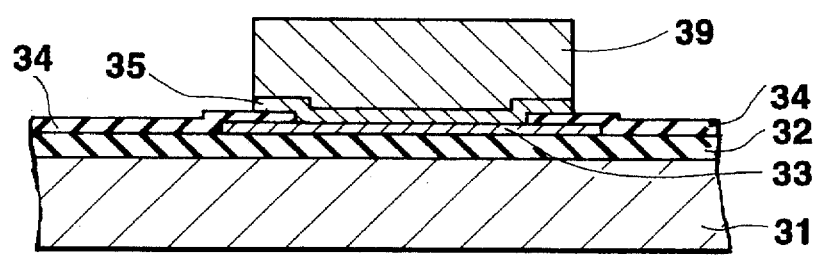
FIG. 3(E) shows a section of a final product of a prior-art projecting electrode structure.

As shown in FIGS. 2(B)–2(D), the thin conductive layer 11 has a double-layered structure. A first layer 11a of the thin-film layer 11 is produced by sputtering a metal, such as Cr or Ti, providing an enhanced bonding of the first layer 11a with the organic projection 9. The first layer 11a has a thickness of about 500–1000 Å. A second layer 11b of the thin-film layer 11 is formed over the first layer 11a by sputtering a metal such as Au in order to prevent the oxidation of the surface of the first layer 11a and reduce an electric resistance of a connection between another electronic device mounted on the organic projection 9. The second layer 11b has a thickness of about 500–1000 Å.

The side surfaces of the organic projection 9 are tapered which facilitates the conductive material of the thin conductive layer 11 to deposit on the side surfaces of the organic projection 9. Therefore, the thin conductive layer 11 is securely formed on the surfaces of the organic projection 9.

Subsequently, a resist (not shown) is applied to the surfaces of the thin conductive layer 11.

Subsequently, this resist layer is exposed to light energy (not shown) through a photomask (not shown).

Subsequently, developing the resist layer provides the resist layer 12 having a predetermined pattern which remains on only the surfaces of the organic projection 9 and that part of the thin conductive layer 11 surrounding the bottom of the organic projection 9, as shown in FIG. 2(C).

Subsequently, the thin conductive layer 11 and the metal substrate layer 5 are etched and the resist 12 is eliminated to thereby pattern the conductive thin film layer 11 so that as shown in FIG. 2(D) the thin conductive layer 11 remains on only the surfaces of the organic projection 9 and that part of the metal substrate layer 5 surrounding the bottom of the organic projection 9. Thus, the projecting electrode 13 having the organic projection 9 as the core and a predetermined pattern is formed. Hereupon the organic projection 9 is within the range of the metal substrate layer 5.

In the projecting electrode 13, the thin conductive layer 11 is electrically connected to the aluminum electrode 3 through that part of the metal substrate layer 5 surrounding the bottom of the organic projection 9.

In the inventive process, the organic projection 9 of an insulating heat-resistant organic material is formed on the metal substrate layer 5 formed on the aluminum electrode 3 and the thin conductive layer 11 is formed by the dry thin-film formation technique on the surface of the organic projection 9. This structure secures the electrical conductivity of the projecting electrode. This structure allows the projecting electrode to be formed by the dry process and requires no need for electroplating process. This makes the electroplating solution control unnecessary and eliminates defective appearances in the projecting electrode which might otherwise be caused by air bubbles from the electroplating solution.

The inventive process provides the following advantages of: 1) reducing an amount of a metal material for the projecting electrode, 2) improving the height uniformity of the projecting electrode to ±1000 Å or less in a chip or ±1.0 μm in a semiconductor substrate and 3) improving the productivity.

The above embodiments employ polyimide as the organic material. The present invention is not limited to polyimide but is applicable to other organic materials.

The present invention is not rigidly restricted to the embodiments described above. It is to be understood that a person skilled in the art can easily change and modify the present invention without departing from the scope of the invention defined in the appended claims.

What is claimed is:

1. A projecting electrode structure, comprising:
   an electrode provided on a substrate;
   a first conductive layer provided on said electrode, said first conductive layer being double-layered, a first layer of said first conductive layer adjoining said electrode and being made of one of nickel (Ni) and aluminum (Al), and a second layer of said first conductive layer being made of one of chromium (Cr) and titanium (Ti);
   an insulating projection provided at a center of an upper surface of said first conductive layer within a surface area range of said first conductive layer; and
   a second conductive layer covering the surface of said insulating projection and covering portions of said first conductive layer surrounding said insulating projection, said second conductive layer being electrically coupled to said first conductive layer.

2. The projecting electrode structure of claim 1, wherein said insulating projection includes a tapered portion.

3. The projecting electrode structure of claim 2, wherein said insulating projection is made of an organic material.

4. The projecting electrode structure of claim 3, wherein said second conductive layer includes a first layer adjoining said insulating projection, said first layer of said second conductive layer being made of one of chromium (Cr) and titanium (Ti), and said second conductive layer includes a second layer made of gold (Au).

5. The projecting electrode structure of claim 4, wherein the organic material is polyimide.

6. The projecting electrode structure of claim 5, wherein said substrate comprises a semiconductor.

7. The projecting electrode structure of claim 1, wherein said insulating projection is made of an organic material.

8. The projecting electrode structure of claim 7, wherein said second conductive layer includes a first layer adjoining said insulating projection, said first layer of said second conductive layer being made of one of chromium (Cr) and titanium (Ti), and said second conductive layer includes a second layer made of gold (Au).

9. The projecting electrode structure of claim 8, wherein the organic material is polyimide.

10. The projecting electrode structure of claim 9, wherein said substrate comprises a semiconductor.

11. A projecting electrode structure, comprising:
    an electrode provided on a substrate;
    a first conductive layer provided on said electrode;
    an insulating projection provided at a center of an upper surface of said first conductive layer within a surface area range of said first conductive layer; and
    a second conductive layer covering the surface of said insulating projection, said second conductive layer having a peripheral portion piled upon said first conductive layer in a direction of thickness of said peripheral portion of said second conductive layer so that said second conductive layer is electrically coupled to said first conductive layer, and said second conductive layer including a first layer and a second layer, said first layer of said second conductive layer being made of one of chromium (Cr) and titanium (Ti) and said second layer of said second conductive layer being made of gold (Au).

12. The projecting electrode structure of claim 11, wherein said insulating projection is made of an organic material.

13. The projecting electrode structure of claim 11, wherein said insulating projection includes a tapered portion.

14. A projecting electrode structure, comprising:

an electrode provided on a substrate;

a first conductive layer provided on said electrode;

an insulating projection provided at a center of an upper surface of said first conductive layer within a surface area range of said first conductive layer; and a second conductive layer covering the surface of said insulating projection, said second conductive layer having a peripheral portion piled upon said first conductive layer in a direction of thickness of said peripheral portion of said second conductive layer so that said second conductive layer is electrically coupled to said first conductive layer, and said second conductive layer being plural-layered, wherein a periphery of said second conductive layer coincides with a periphery of said first conductive layer.

15. The projecting electrode structure of claim 14, wherein said insulating projection is made of an organic material.

16. The projecting electrode structure of claim 14, wherein said insulating projection includes a tapered portion.

17. The projecting electrode structure of claim 14, further comprising an insulating layer covering a peripheral portion of said electrode, and wherein said insulating projection includes a peripheral portion located above a portion of said insulating layer through said first conductive layer.

18. The projecting electrode structure of claim 17, wherein said insulating projection is made of an organic material.

19. The projecting electrode structure of claim 18, wherein said insulating projection includes a tapered portion.

* * * * *